United States Patent

Poirier

[11] 4,123,733
[45] Oct. 31, 1978

[54] METHOD OF FILTERING ANALOGUE SIGNALS BY TRANSFERRING ELECTRICAL CHARGES IN A SEMICONDUCTOR MEDIUM

[75] Inventor: Raymond Poirier, Paris, France

[73] Assignee: Thomson-CSF, Paris, France

[21] Appl. No.: 661,151

[22] Filed: Feb. 25, 1976

[30] Foreign Application Priority Data

Feb. 28, 1975 [FR] France .................. 75 06252

[51] Int. Cl.² ............... H03H 7/28; H01L 29/10; H01L 27/10; G11C 27/02
[52] U.S. Cl. ............... 333/70 T; 307/221 D; 357/24
[58] Field of Search ........... 307/221 R, 221 D, 221 C, 307/304; 235/181; 333/70 R, 70 T, 70 A, 29; 328/165, 167; 357/24; 340/146.2

[56] References Cited

U.S. PATENT DOCUMENTS

| | | | |
|---|---|---|---|
| 3,670,151 | 6/1972 | Lindsay et al. | 333/29 |
| 3,819,958 | 6/1974 | Gosney | 307/221 D X |
| 3,930,255 | 12/1975 | Means | 307/221 D X |
| 3,947,698 | 5/1976 | Cheek, Jr. et al. | 307/221 D |

Primary Examiner—Alfred E. Smith
Assistant Examiner—Marvin Nussbaum
Attorney, Agent, or Firm—Oblon, Fisher, Spivak, McClelland & Maier

[57] ABSTRACT

A transversal filter utilizing a double tapped delay line, is provided. Input samples of analogue signals are successively introduced into a charge transfer device comprising two tapped delay lines using split electrodes. Tap weights of both polarities are provided by collecting portions of split electrodes and summed on a single bus bar connected to a reading system delivering filtered signals.

7 Claims, 7 Drawing Figures

METHOD OF FILTERING ANALOGUE SIGNALS BY TRANSFERRING ELECTRICAL CHARGES IN A SEMICONDUCTOR MEDIUM

This invention relates to a method of filtering analogue signals by transferring electrical charges in a semiconductor medium, and to the filters using this method.

The transfer of electrical charges in a semiconductor medium is carried out with devices of the "metal-insulator-semiconductor" type. Charge coupled devices (C.C.D.) and bucket brigade devices (B.B.D.) for example are already known. In both cases, a shift register is formed by applying suitable potentials to rows of electrodes. In the shift register thus formed, electrical charges are transferred from one element of the register to the following element in quantities proportional to a signal sample. The potentials applied to the successive electrodes emanate from a multiple output "clock", the potentials supplied by two outputs adjacent the clock being staggered in time by a fraction $1/n$ of the period of the clock signals. Two-phase, three-phase and four-phase charge transfer devices are already known.

Electrical filtering comprises shaping an analogue signal in dependence upon the theoretical pulse response of the filter. In the case of filters comprising shift registers, shaping is carried out with successive sample signals introduced at the input of the register and collected at various stages (on the electrodes of a predetermined phase) to be combined by weighted algebraic summation and delivered to the output of the filter.

In one known method, two bus bars for the weighted collection of charges are fed by a common clock phase. Each bus bar is connected to an electrode fraction (divided into two insulated portions) normally fed by said phase. Two fractions equal to half one normal electrode give a zero weighting, and two unequal fractions give a weighting between zero and one, because the signs + and − are allocated to the two bars. The bars are connected to the + and − inputs of a differential amplifier of which the output gives a sampling of the filtered signal.

One disadvantage of the method described above arises out of the fact that the potentials of the electrodes vary only slightly in relation to the absolute value of the working potential of the clock bars. Under these conditions, the differential amplifier gives signals full of significant relative errors.

The present invention obviates this disadvantage.

According to the invention, there is provided a method of filtering analogue signals by charge transfer in a semiconductor medium, comprising:
 forming input samples of analogue signals;
 introducing them into a charge transfer delay line consisting of phase electrodes and so-called collecting electrodes or portions of such electrodes on which are collected signals expressing algebraically the charge transfers so as to form global output samples;
 dividing said charges into two tapped delay lines starting from a predetermined electrode;
 collecting said signals at the same rhythm as the input samples on a single bus bar;
 reading said bus bar and: synthesizing filtered signals.

The invention is described in detail in the following with reference to the accompanying drawings, wherein:
 FIGS. 1 and 2 illustrate the known principles of filtering by shift register.

FIG. 3 diagrammatically illustrates one known application of this filtering principle.

FIG. 4 diagrammatically illustrates two transfer delay line for applying the method according to the invention.

Figure 1:
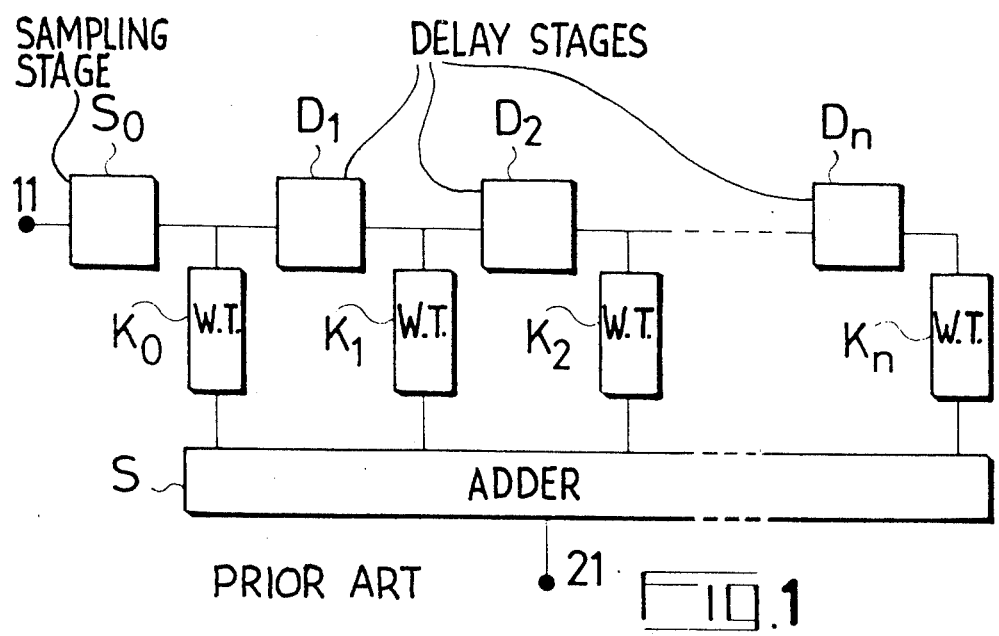
Figure 2:
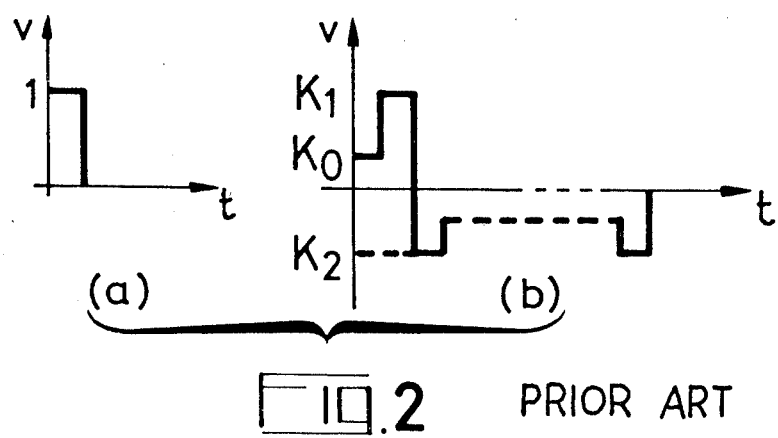

As shown in FIG. 1, a shift register comprises a number of delay stages $D_1, D_2, \ldots D_n$ which act in the same way as delay lines and impart to the signal passing through the register a phase displacement of which the value is governed by the cadence of the clock signals. At the input of the register, a sampling stage $S_o$ cuts off a slice of signal, for example in the form of a voltage pulse $v_e$. In FIG. 2, $(a)$ is a voltage pulse of single amplitude in a graph of cartesian coordinates $t, v$ (time, electrical voltage). The duration of the single pulse is assumed in the interests of simplicity to be equal to the duration of the delay applied by the stages $D_1, D_2$ etc. The reference $(b)$ in FIG. 2 denotes what is collected at the output of the successive stages of the shift register after weighting of the signal by positive or negative coefficients $k_o, k_1 k_2, \ldots k_n$, less than or equal to one in absolute value, said weighting resulting from the action of weighted taps (W.T.) $K_o, K_1, K_2 \ldots K_n$. Since the voltages were equal before weighting to unity and since the signals sampled show increasingly longer delays, the graph of the signals collected is a crenellated line.

The outputs of the sampling stages are connected to the input of an adder S which at its output 2 delivers a signal of amplitude $v_s$, i.e.:

$$v_s + (k_o + k_1 + k_2 + \ldots + k_n) v_e \quad (1)$$

This signal is effectively the signal which would result from the passage through a filter of pulse responses $k_o, k_1, k_2, \ldots k_n$.

Figure 3:
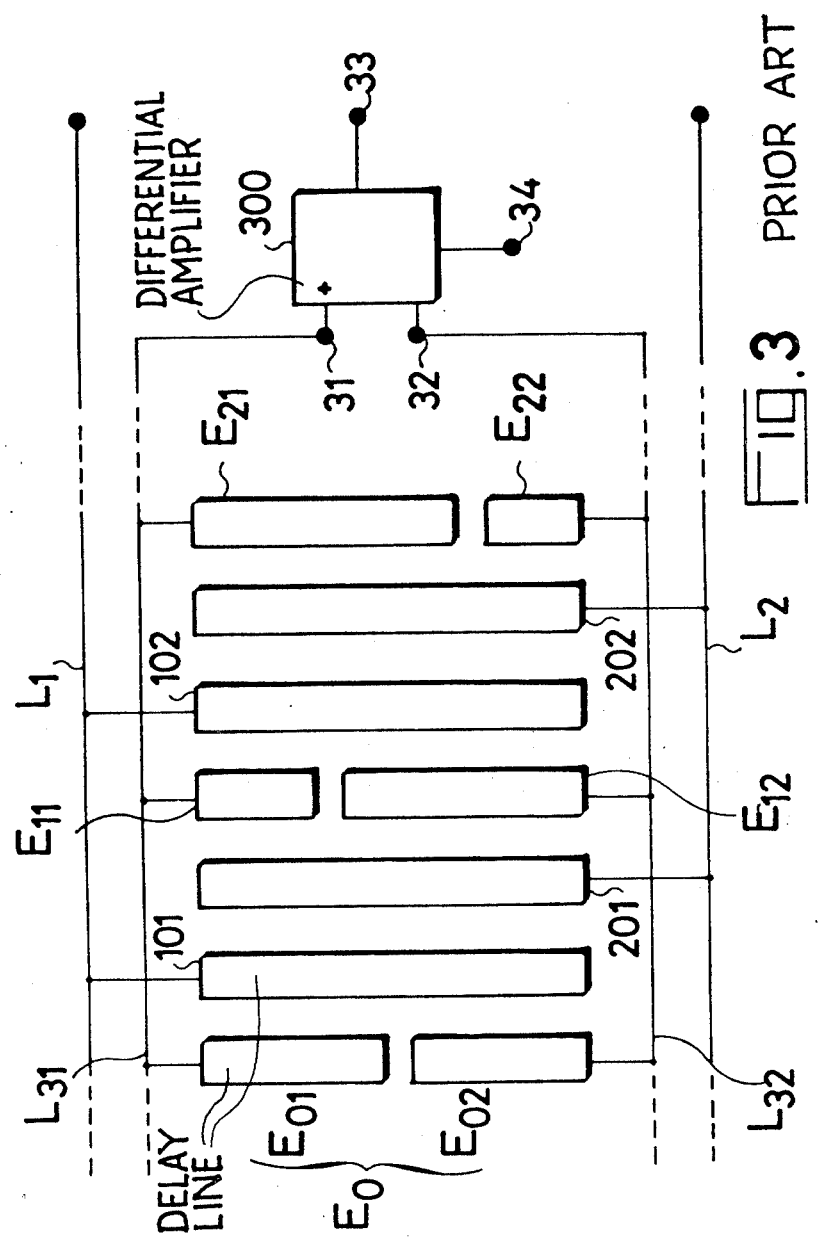

FIG. 3 illustrates the known process, to which reference has already been made, using two separate collecting bus bars in the present case $L_{31}$ and $L_{32}$, fed by a common clock phase (for example the third phase in a three-phase system, FIG. 3) and leading to inputs 31 and 32 of a differential amplifier 300. Sampling is weighted by dividing the collecting electrodes fed by the same clock phase into two parts connected respectively to the lines $L_{31}$ and $L_{32}$ and having surfaces proportional to the following factors:

$\frac{1}{2}(1 + k)$ $\frac{1}{2}(1 - k)$ where $k$ is one of the coefficients $k_1, k_2, \ldots k_n$ of the equality (1). The two other clock phases feed respectively:
 - in the case of the first phase, electrodes 101, 102 etc. . . . through a bar $L_1$,
 - in the case of the second phase, electrodes 201, 202, etc. . . . through a bar $L_2$. the electrodes fed by these phases are not divided and only perform their normal function for transferring the charges along the transfer delay line.

By way of example, there has been illustrated among the collecting electrodes connected to the third phase:

- an electrode $E_o$ divided into two equal parts $E_{o1}$ and $E_{o2}$, which corresponds to $k = o$;
- an electrode divided into two parts $E_{11}$ and $E_{12}$ with surfaces proportional to $\frac{1}{4}$ and $\frac{3}{4}$, which corresponds to $k = -\frac{1}{2}$;
- an electrode divided into two parts $E_{21}$ and $E_{22}$ with surfaces proportional to $\frac{3}{4}$ and $\frac{1}{4}$, which corresponds to $k = +\frac{1}{2}$.

In addition to the inputs + and −, there is an input 33 at the terminals of the differential amplifier 300 for feeding clock signals and an output 34 giving samples of the filtered signal. No circuit for reconstituting the signal by synthesising the samples has been shown. Such a circuit is necessary and requires the delivery of a clock signal.

Figure 4:
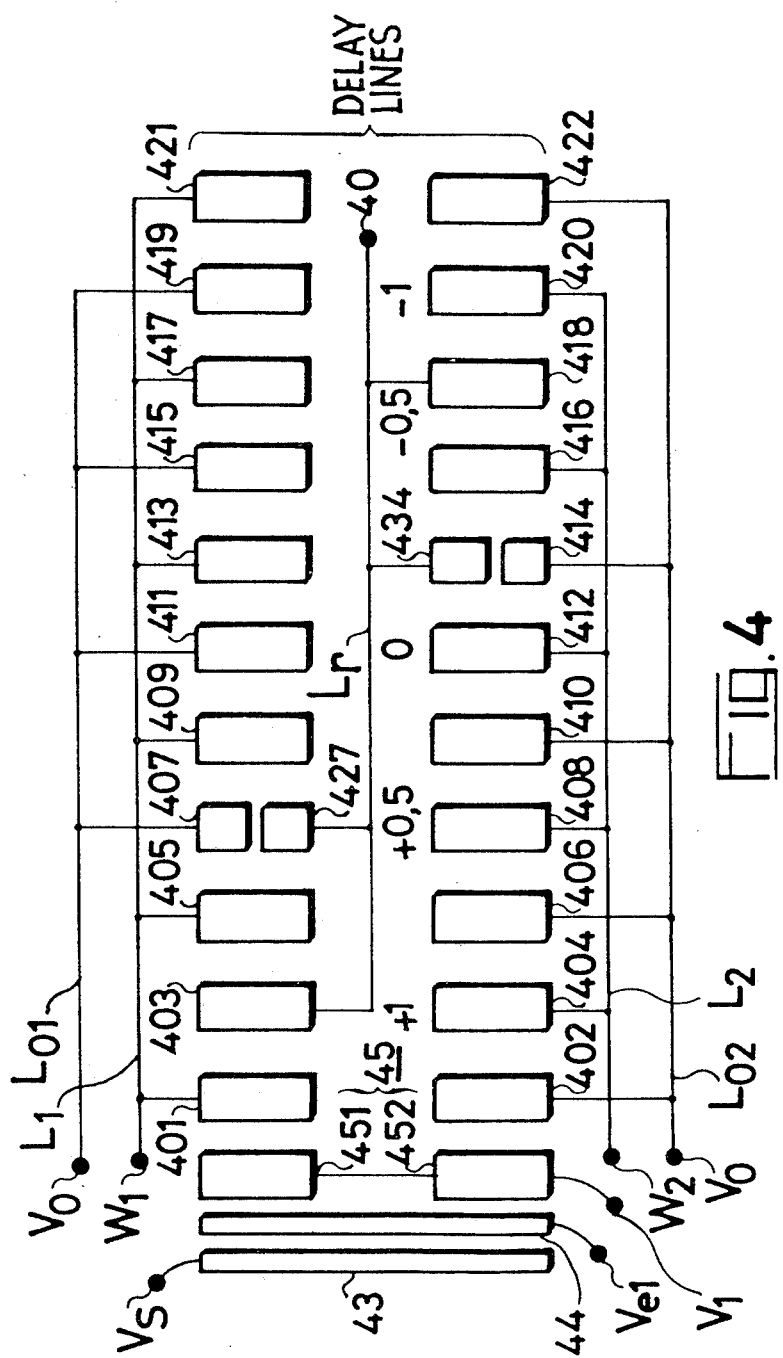

The example of application of the method according to the invention shown in FIG. 4 is based on a two-phase system, the pulse response of the filter to be formed being fixed by way of example by the following series of coefficients $k$:

$$+1, +\tfrac{1}{2}, 0, -\tfrac{1}{2}, -1$$

Two transfer delay lines, comprising two parallel opposite rows of electrodes are formed as follows:
— in the case of the first line, electrodes 401, 405, 409 413, 417, 421 are connected to a first clock bar $L_1$ (phase 1) by successively interposing electrodes 407 (fractional), 411, 415, 419 connected to a feed bar $L_{o1}$;
— in the case of the second line, electrodes 402, 406, 410, 414 (fractional) 422, connected to a feed bar $L_{o2}$, by successively interposing electrodes 404, 408, 412, 416 and 420 connected to the second clock bar $L_2$ (phase 2).

In addition, the following collecting electrodes are connected by a single collecting bar $L_r$ to an output terminal 40:
— in the first line, the electrode 403 ($k = 1$) and a fractional electrode 427 situated in the extension of the electrode 407: these two electrodes, each equal to half a normal electrode, allow a weighting corresponding to $k = +0.5$;
— in the second line, the electrode 418 ($k = -1$) and a fractional electrode 434 situated in the extension of the electrode 414: these two electrodes, each equal to half a normal electrode, allow a weighting corresponding to $k = -0.5$.

At the entry of the system, three electrodes are arranged in such a way as to form a common input for the two lines. The electrodes in question are:
— an electrode 43, fed by a terminal $V_s$ with an input signal of voltage $V_s$ before sampling;
— an electrode 44, fed by a terminal $V_{e1}$ and constituting the grid of an MOS (metal oxide semiconductor) transistor acting as a "gate" providing access for a slice of signal to the input of the lines;
— an electrode 45 divided into two fractions 451 and 452 fed by a terminal $V_1$ with pulsed voltage $V_1$, of which the operation will be described hereinafter.

Figure 5:
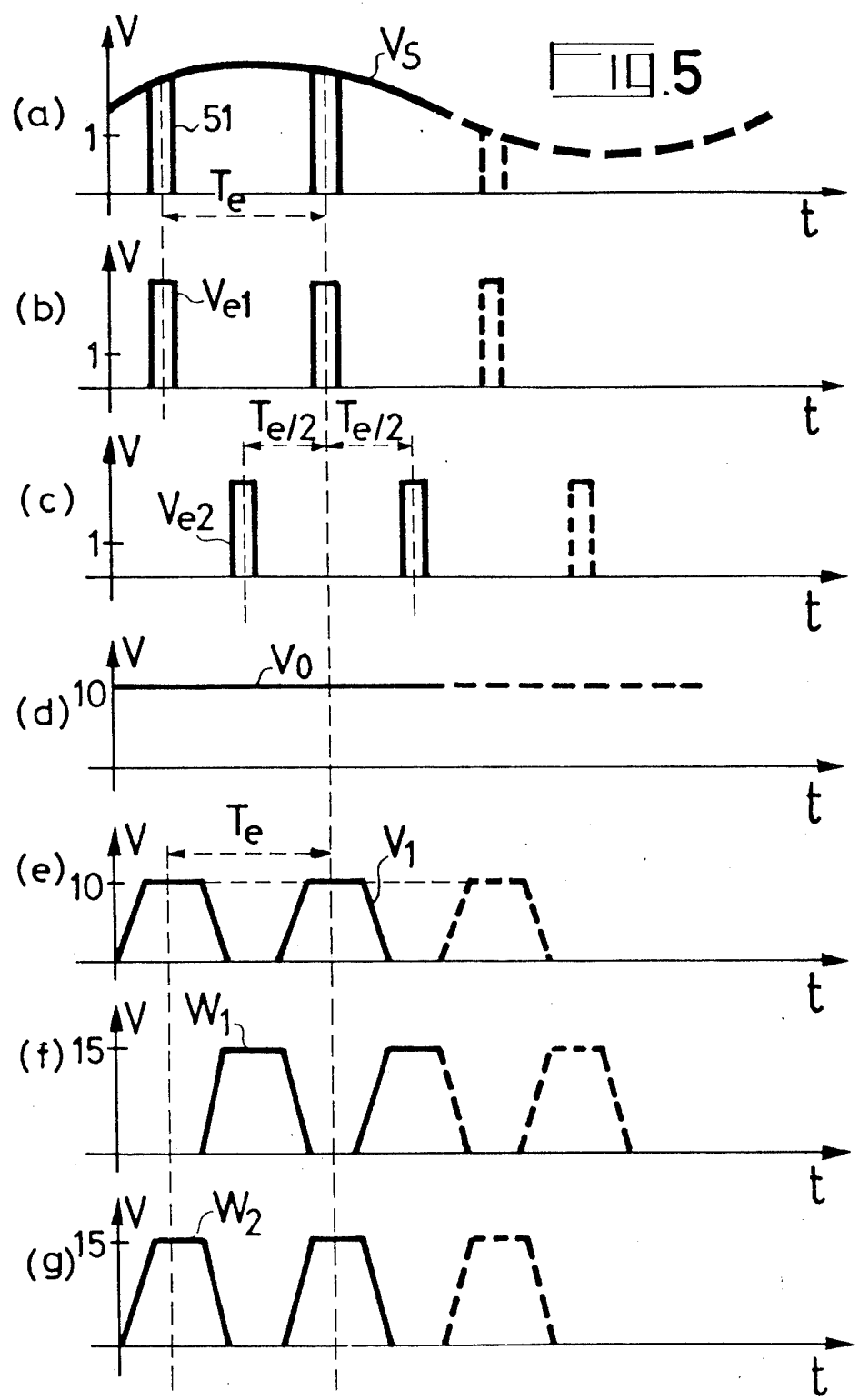
FIG. 5 shows graphs explaining the operation of the transfer delay lines shown in FIG. 4.

In the graphs shown in FIG. 5, the voltages in volts (on different scales) applied at various points of the arrangement shown in FIG. 4 are plotted as abscissae as a function of the time $t$:
— (a) is the curve of the signal $V_S$ applied to the electrode 43 and the samples taken at time intervals $T_e$ and represented by pulses 51; it should be noted that the voltage $V_S$ should not change direction (positive or negative, according to the doping of the semiconductor) which presupposes, if necessary, the superposition of the signal with a positive d.c. voltage before application to the electrode 43: the technique involved is well known;
— (b) is the curve representing a series of voltage pulses $V_{e1}$ applied to the electrode 44 with the frequency $T_e$ at the successive sampling times: it is these pulses which opens the "gate" formed by an "MOS" transistor of which the electrode 44 forms the grid; $V_{e1}$ is at least equal to the greatest amplitude of the signal $V_S$;
— (c) is the curve representing pulses $V_{e2}$ whose amplitude is considerably greater than $V_S$, for example 10 volts, but which have the same frequency as $V_{e1}$ although they are staggered by half a cycle; they perform a function in the operation of the arrangement shown in FIG. 6;
— (d) = the curve of a d.c. voltage $V_o$, for example 10 volts, applied to the bars $L_{o1}$ and $L_{o2}$;
— (e) is the curve of a pulsed voltage $V_1$ with a maximum amplitude equal to $V_o$ and synchronised with the pulses $V_{e1}$;
— (f) and (g) are curves representing the pulsed voltages $W_1$ and $W_2$ with the same maximum amplitudes greater than $V_o$, i.e. for example 15 volts, applied to the bars $L_1$ and $L_2$; these voltages are staggered by $T_e/2$ and $W_2$ is synchronised with $V_1$.

The mode of operation is as follows in the case of a "p" doped semiconductor material transferring negative charges, i.e. electrons ("holes" in the case of "N"-type doping): each pulse $V_{e1}$ causes a quantity of electrons proportional to the sample 51 to be transferred from the electrode 43 to the electrode 45 because the voltage $V_{e1}$ is always higher than the voltage $V_S$. The electrons accumulate in a "pit" formed in the semiconductor material by the voltage pulse $V_1$ on the electrode 45. After the pulse $V_1$, a pulse $W_1$ appears at the electrode 401 and draws the electrons under the electrode 401. The "odd" line (electrodes 401–421) is then traversed in the same way as a conventional register, with the difference that the second phase is fed by a d.c. voltage $V_o$ below the potential $W_1$. The transfer of charges from 401 to 403 during the interval between two pulses $W_1$ is caused by the presence of $V_o$, whilst the transfer from 403 to 405 is due to the fact that $W_1$ is higher than the d.c. potential $V_o$. At predetermined moments, the reading potential available at the terminal 40 is modified by the charges which have accumulated below the electrodes 403 (with a coefficient $k = +1$) and 427 (with a coefficient $K = 0.5$). The "gate" circuit which allows reading to take place at the said predetermined moments has not been shown.

The phenomena are similar with a delay of half a cycle for the even line (electrodes 402–422), with the important difference that the reading potential is modified with an advance of one cycle due to the connections established with the electrodes 434 and 418, which is equivalent to recording the beginning of the chages and to the allocation of a coefficient −0.5 (fractional electrode 434) or −1 (electrode 418) to sampling.

Figure 6:
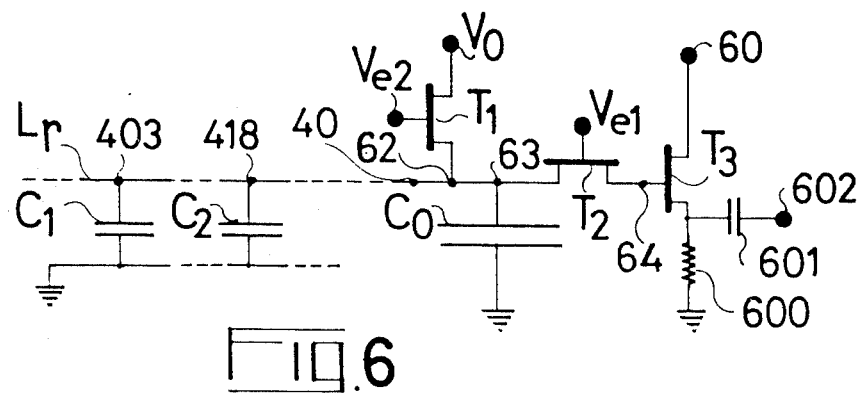
FIG. 6 is a circuit diagram of one embodiment of the invention.

FIG. 6 shows sections of the bar $L_r$, especially those to which the electrodes 403 (first register) and 418 (second register) are connected, and the end of this bar terminating at the terminal 40. A capacitor such as $C_1$, having one armature connected to earth and the other to the electrode 403, constitutes an equivalent scheme for a semiconductor element of the charge transfer device. The same applies to $C_2$ under the electrode 418. The actual reader is formed by a capacitor $C_o$ and three transistors $T_1$, $T_2$ and $T_3$ of the "MOS" type. The terminal 40 is followed successively, in continuation of the bar $L_r$, by a branch terminal 62, through which the bar is fed with d.c. voltage $V_o$ by the channel of the transistor $T_1$ of which the grid is controlled by the voltage pulses $V_{e2}$ (FIG. 5c), and by a branch terminal 63 connected to earth through a capacitor $C_o$ of high value in relation to the capacitors $C_1$ and $C_2$. The bar is extended to the grid 64 of the transistor $T_3$ by the channel of the transistor $T_2$ of which the grid is controlled by the pulses $V_{e1}$ (FIG. 5b). The transistor $T_3$ is connected as an amplifier-follower with a drain fed directly with d.c. voltage by a terminal 60 and a source connected to earth through a resistor 600. The reading signal is collected ahead of this resistor at a terminal 602 through a capacitor 601.

The reading operation is as follows: when $W_1$ is applied to $L_1$, $V_{e2}$ brings the potential of the electrodes connected to $L_r$ to the potential $V_o$, charging (or discharging) all the capacitors $C_o$-$C_1$, etc. . . . $W_2$ is then applied to $L_2$ and the potential of the terminal 40, taking into account the capacitor $C_o$, is influenced, depending on the moment in question, — sometimes by the influx of transfer charges below the collecting electrodes, — sometimes by the departure of charges.

The grid 64 is connected to the voltage of the terminal 63 at the moment of the pulse $V_{e1}$, i.e. with a phase displacement of $T_e/2$ relative to the pulse $V_{e2}$. If $V_{e1}$ and $V_{e2}$ are reversed, the sign of the sampling coefficient of the charges is reversed as well.

The transistor $T_3$ delivers current pulses which, through the resistor 600 and the capacitor 601, produce voltage pulses at the terminal 602.

In one variant of the invention, the line is not doubled in the same way as in FIG. 4. The charges are divided into two groups at the moment they pass an electrode situated immediately before a fractional electrode.

It is known that, by heavily doping a surface zone (Z, FIG. 7) of the semiconductor material below a phase electrode, it is possible to separate the charges situated on either side of the zone Z.

Figure 7:
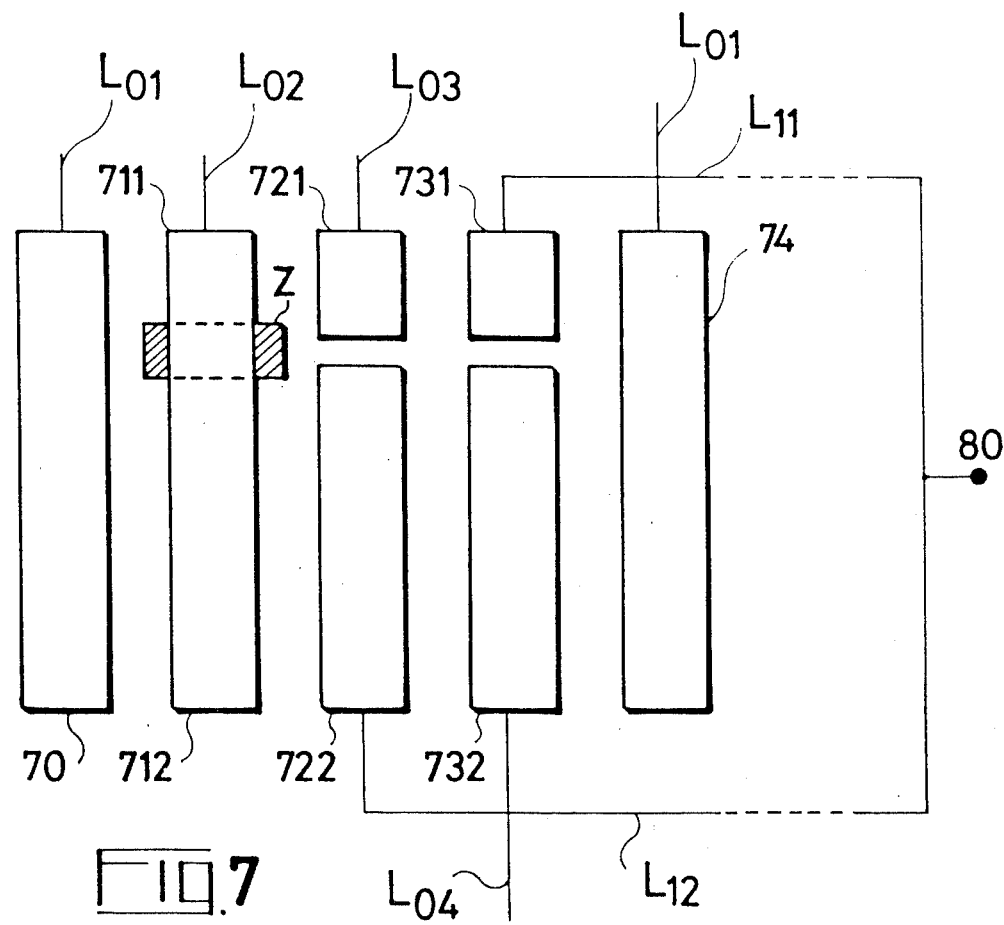
FIG. 7 shows a modified embodiment of the invention.

FIG. 7 shows by way of example a fraction of a four-phase line (electrodes 70 to 74 fed by phase lines $L_{01}$, $L_{02}$, $L_{03}$, $L_{04}$ and back to $L_{01}$). The second electrode covers the zone Z which determines the allocation of charges between the regions of the semiconductor material situated below the portions 711 and 712 of the electrode in question. The following two electrodes are divided into fractional electrodes 721 and 722 on the one hand, 731 and 732 on the other hand. The charges collected at the common terminal 80 by the bar $L_{11}$ (connected to 731) and $L_{12}$ (connected to 722) perform a similar function to the charges collected at the terminal 40 from the electrodes 403 and 418 of the arrangement shown in FIG. 4. However, it is pointed out that, in the case of FIG. 7, the phase electrodes such as 401 and 402 shown in FIG. 4 may be imagined to have been extended to form only a single electrode with creation of a separation zone Z. In the case of the fractional electrodes (407:427 and 414/434), therefore, the portions 427 and 434 may be imagined to have been jointed to the electrodes 408 and 413, respectively.

In addition to the advantages already mentioned, the invention has the following advantages as well:

— the synthesis of filtered signal samples without any need for recourse to new clock signals;

— the possibility of using both bucket brigade devices and charge coupled devices;

— the possibility of integrating the reader shown in FIG. 6 on the same semiconductor plate as the charge transfer device.

What I claim is:

1. A method of filtering analogue signals by charge transfer in a semiconductor medium, consisting of:

taking samples of said signals at the rhythm of a first phase of a twophase clock;

introducing them simultaneously into a first and a second charge transfer delay line, each of said lines comprising a first and a second series of electrodes having surfaces, the maximum of which is S, said electrodes of both series being mutually parallel and of a constant pitch, the series being sandwiched, and the electrodes of said second series being divided into a first and a second portions having a total surface equal to S, the surface ratio of said second portion to said surface S representing the proportion of transferred charges to be collected according to a previous calculation, one of said portions being equal to zero as the case may be;

feeding the electrodes of first series by one phase in the case of said first delay line and by the other phase in the case of said second delay line;

feeding said first electrode portions of both lines under a constant voltage;

collecting filtered signals on a single bus bar connected to said second portions of both lines.

2. A filter using a filtering method as claimed in claim 1, comprising:

a common input stage;

a charge transfer tapped delay line consisting of a first series of electrodes fed by a first phase of a two-phase clock system, a second series of electrodes alternating with those of said first series and having a surface equal to all or part of electrodes of the first series, and a third series of electrodes each of them being in the extension of a fractional electrode of said second series;

a bus bar connected to the electrodes of said third series; and a reading system.

3. A filter as claimed in claim 2, wherein said common input stage comprises:

a first electrode intended to receive the signal to be filtered, a second electrode controlling the taking of samples and a third electrode comprising two parts of which each has the same surface as a delay line electrode and which is fed by a pulse voltage synchronised with one of the phases.

4. A filter as claimed in claim 2, wherein said reading system comprises one capacitor, a circuit for periodically re-establishing the charge of said capacitor, a periodically controlled output gate and an output amplifier.

5. A filter as claimed in claim 4, wherein said reading system is integrated on the same semiconductor plate as the delay line and exclusively comprises capacitors, resistors.

6. A method of filtering analogue signals by charge transfer in a semiconductor medium, consisting of:

taking samples of said signals at the rhythm of a first phase of a fourphase clock;

introducing them into a charge transfer delay line comprising a first, a second, a third and a fourth series of electrodes, said electrodes being mutually parallel sandwiched and of a constant pitch, said first and second series of electrodes having a constant surface S, the electrodes of said third and fourth series being divided into a first and a second portion, the difference between the surface of said second portions of said third series and said first portion of said fourth series representing the proportion of transferred charges to be collected according to a previous calculation, one of said portions being equal to zero as the case may be;

feeding the electrodes of first and second series respectfully by the first and second phase of said four-phase clock;

feeding the electrodes of said third series by the third phase of said clock and the electrodes of said fourth series by the fourth phase of said clock; and collecting filtered signals on a first and a second bus bars having a common end terminal, said first bar being connected to said second portions of said third series and said second bar being connected to said first portions of said fourth series.

7. A filter, using a filtering method as claimed in claim 6, comprising:

a common input stage wherein an electrode covers a zone of the semiconductor medium capable of determining an allocation of the charges between two regions of said medium;

said charge transfer delay line contiguous to said common input stage; and a reading system.

* * * * *